(12) United States Patent
Haase et al.

(10) Patent No.: US 8,710,533 B2
(45) Date of Patent: Apr. 29, 2014

(54) MULTICOLORED LIGHT CONVERTING LED WITH MINIMAL ABSORPTION

(75) Inventors: Michael A. Haase, St. Paul, MN (US); Junqing Xie, Woodbury, MN (US); Thomas J. Miller, Woodbury, MN (US); Xiaoguang Sun, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/701,145

(22) PCT Filed: May 31, 2011

(86) PCT No.: PCT/US2011/038580
§ 371 (c)(1),
(2), (4) Date: Nov. 30, 2012

(87) PCT Pub. No.: WO2011/153153
PCT Pub. Date: Dec. 8, 2011

(65) Prior Publication Data
US 2013/0075775 A1    Mar. 28, 2013

Related U.S. Application Data

(60) Provisional application No. 61/351,581, filed on Jun. 4, 2010.

(51) Int. Cl.
*H01L 33/00* (2010.01)
(52) U.S. Cl.
USPC .............. 257/98; 257/13; 257/14; 257/79; 257/88; 257/90
(58) Field of Classification Search
CPC ..... H01L 33/50; H01L 33/502; H01L 33/504; H01L 33/508
See application file for complete search history.

(56) References Cited

U.S. PATENT DOCUMENTS

| | | |
|---|---|---|
| 2008/0142816 A1 | 6/2008 | Bierhuizen |
| 2009/0072263 A1 | 3/2009 | Paolini |
| 2011/0186877 A1* | 8/2011 | Haase et al. ............... 257/89 |

FOREIGN PATENT DOCUMENTS

| | | |
|---|---|---|
| WO | WO 2009/148717 A1 | 6/2006 |
| WO | WO 2008/072196 A1 | 6/2008 |
| WO | WO 2006/062588 A1 | 12/2009 |
| WO | WO 2011/153034 A1 | 12/2011 |
| WO | WO 2011/153141 A2 | 12/2011 |

OTHER PUBLICATIONS

U.S. Appl. No. 61/351,581 to Haase et al., filed Jun. 4, 2010, entitled *Multicolored Light Converting LED with Minimal Absorption*.
U.S. Appl. No. 61/351,566 to Haase et al., filed Jun. 4, 2010, entitled *Light Converting and Emitting Device with Minimal Edge Recombination*.
U.S. Appl. No. 60/893,804 to Haase, filed Mar. 8, 2007, entitled *Array of Luminescent Elements*.
International Application PCT/US2011/038580 International Search Report dated Aug. 22, 2011.
International Application PCT/US2011/038580 Written Opinion of the International Searching Authority dated Aug. 22, 2011.

* cited by examiner

*Primary Examiner* — Kyoung Lee
(74) *Attorney, Agent, or Firm* — Daniel J. Iden

(57) ABSTRACT

Light emitting systems are disclosed. More particularly light emitting systems that utilize wavelength converting semiconductor layer stacks, and preferred amounts of potential well types in such stacks to achieve more optimal performance are disclosed.

20 Claims, 2 Drawing Sheets

MULTICOLORED LIGHT CONVERTING LED WITH MINIMAL ABSORPTION

CROSS REFERENCE TO RELATED APPLICATIONS

The present application relates generally to the following co-filed and commonly assigned U.S. Patent Application: "Light Converting and Emitting Device with Minimal Edge Recombination", 61/351,566.

FIELD OF THE INVENTION

This invention generally relates to light emitting systems. Particularly, this invention relates to light emitting systems that utilize wavelength converting semiconductor layer stacks.

BACKGROUND

Illumination systems are used in many different applications, including projection display systems, backlights for liquid crystal displays and the like. Often, projection systems use one or more white light sources, such as high pressure mercury lamps. However, increasingly, light emitting diodes (LEDs) have been considered as alternatives to other white light sources. LEDs have the potential to provide the brightness and operational lifetime that would compete with conventional light sources. Current LEDs, however, especially green emitting LEDs, are relatively inefficient.

Because of this inefficiency, wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together.

One approach to generating white light with a single LED is to first generate blue light with the LED and then to convert some or all of the light to a different color. For example, a portion of the blue light may be converted to red light, and a portion of the blue light may be converted to green light, such that the resultant output light, when mixed, is white. One common problem, however, when utilizing such a system of light converting layers is that a good deal of light may be reabsorbed by the light converting layers after an initial color conversion. In particular, green light that is converted from blue light is at risk for being absorbed by red potential wells. Such absorption can have negative effects on both the desired color balance of the light emitting system, as well as its efficiency. It would be desirable to provide a light converting LED that was capable of minimizing green light absorption.

SUMMARY OF THE INVENTION

In one aspect, the present invention relates to a light emitting system. The light emitting system includes an LED that emits pump light of a first wavelength from an emission surface of the LED, and a stack of semiconductor layers disposed on the emission surface of the LED. The semiconductor layer stack includes m first type potential wells that absorb pump light and emit light of a second wavelength longer than the first wavelength. The value of m is an integer greater than or equal to one. The semiconductor layer stack also includes n second type potential wells that absorb pump light and emit light of a third wavelength longer than the first wavelength and shorter than the second wavelength. The value of n is an integer greater than m. The semiconductor layer stack further includes at least one region in the stack that allows a portion of the pump light of the first wavelength to exit the light emitting system without going through the first or second type potential wells optically coupled to the electroluminescent device.

DETAILED DESCRIPTION

This application discloses light emitting systems that use semiconductor layer stacks to convert at least a portion of pump light that impinges on the stack. More particularly, this application provides for amounts or ratios of first type potential wells to second type potential wells in such stacks or systems that may be used to minimize absorption of light that has been converted into light of a different wavelength, and maximize efficiency along with color balance. In addition, this application provides for constructions of light emitting systems that allow for highly efficient emission of multi-color or white light.

A number of previous color converting light emitting systems utilize a stack of color-converting semiconductor layers made of materials such as II-VI semiconductors, or phosphors. All of the light is emitted from one common stack that covers essentially the entire surface of the pump LED. In a number of systems, the desired emission is white or near white light generated by partial conversion of the emission from a blue LED. Some of the blue light may be converted by layers into, for example, red light, and some of the blue pump light may be converted by layers into, for example, green light. A mixture of blue, green, and red light may result in a suitable white emission light. However, in order to provide the correct mixture in such systems, it is necessary to allow some of the blue light to "leak" through the stack of layers without being converted. Unfortunately, in such systems it can be difficult to control the color balance, i.e., the ratio of blue to green and red emission. Some of the blue light is inevitably reflected from the emitting surface of the converting stack. This effect is exacerbated by the use of extraction features on the emitting surface to improve extraction of converted wavelengths from the converter stack. Such backscattering and subsequent absorption by the converter stack makes it difficult to control the relative amount of blue light transmitted. The present invention seeks in part to address this issue by incorporating apertures in a wavelength converter stack to allow blue light to pass unconverted through the apertures in the stack, while the stack converts all, or close to all of the blue light that travels through the stack. This allows for greater efficiency and control of the balance of colors. It should be understood that non-converting regions may at times be referred to as "apertures." For purposes of this disclosure, "aperture" is intended to have the same meaning as a non-converting region. It is not intended to limit the different materials or functional optical elements that may be located within the region. Hereinafter, reference to light at a wavelength $\lambda$ is meant to indicate that the centroid of the spectrum of the light is at a wavelength $\lambda$.

Figure 1:
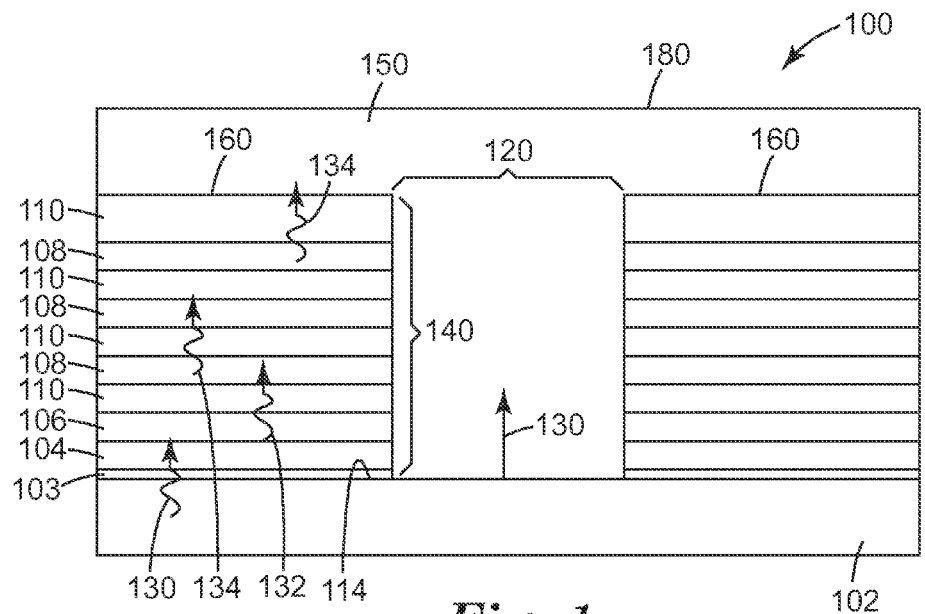
FIG. 1 is a cross-sectional view of a light emitting system.

A better understanding of such non-converting regions may be understood by reference to FIG. 1. FIG. 1 is a cross-sectional view of a light emitting system according to the present description. In the light emitting system 100, pump light 130 of a first wavelength is emitted from LED 102. Only some of the pump light travels through the semiconductor layer stack 140 for color conversion. The remainder of pump light 130 travels through the stack 140 by means of the region 120 without being wavelength converted. When semiconductor layer stack 140 is properly designed, nearly all to all of the light that exits the semiconductor layer stack 140 will be light converted into light of a second wavelength 132 or light of a third wavelength 134. The balance of first wavelength light 130 to second and third wavelength light may be in part managed by the width of the region 120.

Despite this ability to better manage the amount of pump light that is allowed through to the emission surface 180, there remain issues within semiconductor layer stack 140 with efficiency and balance of light 132 and 134. A primary aim of the present description is to further address the issues associated with a light emitting construction 100, particularly those involved in semiconductor layer stack 140, and more particularly involving absorption of light of the third wavelength 134. A more thorough description of the function of light emitting system 100 is necessary to understand the present solution to the associated issues.

As in the systems described above, the current light emitting system may generally be understood as utilizing an LED of a single color rather than multiple LEDs of different colors. The aim of the system is then to convert some of the light of this first color into a second color, and potentially a third, a fourth, fifth color, etc. until the quantity of colors desired at the necessary balance is achieved. Looking to FIG. 1, some of the light of the first wavelength 130 is emitted from the LED 102 and enters the semiconductor layer stack 140. The LED may be a suitable electroluminescent semiconductor device. While the invention does not limit the types of LED semiconductor material that may be used and, therefore, the wavelength of light generated within the LED, it is expected that the invention will be found to be useful at converting blue light. For example, a III-V semiconductor material LED, such as a GaInN or AlGaInN LED that produces blue light, may be used. Other semiconductor materials are also contemplated, including other III-V semiconductor materials. In general, the LED can be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

The first layer that may be encountered as light exits the LED 102 may be an optical adhesive 103 used to bond the converter stack to the LED. The light then passes into the converter stack through surface 114 and into window layer 104. The window layer function will be described below.

Light may then travel either first into an absorbing layer 110, or directly into a potential well. The potential well closest to the emission surface 114 of the LED may be described as a first potential well 106. First type potential well 106 absorbs at least a portion of the pump light of the first wavelength 130 and emits light of a second wavelength 132 that is longer than the first wavelength. For example, where the pump light is blue light, the light of the second wavelength may be red light. The number of first type potential wells may be referred to by a symbol, such as m. In FIG. 1, for example, m is equal to one. In general, m may be an integer that is greater than or equal to one, and less than the number of second type potential wells 108.

After potentially traveling through an absorber layer, discussed below, light may then enter a second type potential well 108. In fact the semiconductor layer stack 140 may contain a plurality of second type potential wells 108. The second type potential wells may be located further from the emission surface 114 of the LED than the first type potential well(s). The second type potential well 108 absorbs light of the first wavelength 130, much like the first type potential well. However, the second type potential well emits light of a third wavelength 134. The light of the third wavelength 134 may be understood as having a wavelength that is longer that the first wavelength (of pump light 130), and shorter than the second wavelength. For example, in some cases, the light of the third wavelength will be green light, where the pump light of the first wavelength is blue, and light of the second wavelength will be red. The number of second type potential wells may be referred to by a symbol, such as n. The value of n is an integer than is greater than the integer m. For example, in FIG. 1, n is equal to 3. One particular aim of the current description is the discovered performance value in providing for the correct amount or ratio of first type potential wells 106 to second type potential wells 108 (or m to n). This is discussed further below.

Light of the first and second wavelengths may both exit the first type potential well(s). Light of the first, second and third wavelengths may all exit the second type potential wells. However, it is desirable that most light of the first wavelength be absorbed and converted before exiting the stack. The absorption is accomplished, because between each of the potential wells of the first type 106 and second type 108, may be located absorber layers 110. The absorbers 110 serve to absorb at least a portion of the pump light of the first wavelength. As a result of this absorption, photo-generated electron-hole pairs are created in the absorber layers 110. These carriers diffuse from the light absorbing layers 110 into the potential well layers 106 and 108. In the potential well layers 106 and 108, the free carriers recombine and emit light at the second wavelength $\lambda_2$ and the third wavelength $\lambda_3$, respectively. In order to provide the most efficient conversion of light, it is therefore desirable for the absorbing layers 110 to be in close proximity to the potential well layers 106 and 108, as shown in FIG. 1. This allows for efficient collection of free carriers into the potential wells with minimum undesirable recombination in the absorber layers 110. Absorbing layers may be made of a semiconductor material, in particular a II-VI semiconductor material. In one embodiment, the absorbing layers are comprised of a composition of Cd, Mg, Zn and Se.

It is especially desirable to absorb or convert all or substantially all of the light of the first wavelength in the current description because of the presence of the non-converting region 120 in the semiconductor layer stack 140. In constructions where a continuous semiconductor layer stack covers the entire LED emitting surface, in order to include a portion of the first wavelength in the emission, a portion of light from the LED may have to be leaked through the stack (and not absorbed or converted). As previously explained, this can result in difficulty in controlling the color balance. The current construction, as shown in FIG. 1, allows for light of the first wavelength 130 to travel without being wavelength converted into the encapsulation area 150 which is made up of a material transparent to pump light. The region 120 may be designed with dimensions such that a given quantity or ratio of light of the first wavelength 130 is allowed to reach the emission surface 180 of the light emitting system without being converted, by traveling through the region 120. With proper design, nearly all light of the first wavelength 130 that enters the semiconductor layer stack 140 may be absorbed and/or converted into light of the second wavelength 132 and light of the third wavelength 134 before emission from the stack at surface 160. After light exits the stack 140, light may be mixed before exiting the light emitting system through emission surface 180. For example, blue light, red light, and green light can mix into white, or near-white light before emission.

The area above the emission area of the semiconductor layer stack 160 and also filling the non-converting region 120 may be a material that is transparent to light of the first wavelength 130. Such material also may be transparent to light of the second wavelength 132 and light of the third wavelength 134. The material filling region 120 and above emission surface 160 may be understood as an encapsulation 150, and may span across the entire light emitting system. The encapsulation 150 may enhance light extraction from the light emitting system 100. The encapsulation 150 may be made up of any number of suitable materials. Some suitable materials, for example, may be glass, silicon nitride, or optical adhesive. Another example of a suitable material may be a polymer encapsulant, such as a silicone. The emission surface 180 of the light emitting system 100 may therefore be an interface between the above-described material and the external material, for example, air.

Other suitable materials for the encapsulation 150 are also contemplated. For example, encapsulation 150 may include metal oxides such as $Al_2O_3$, $TiO_2$, $ZrO_2$, $La_2O_3$, $Ta_2O_5$, $HfO_2$, silicate, silicon oxinitride, or indium-tin oxide. In some cases, the encapsulation 150 can be a semiconductor overcoat, such as an overcoat containing ZnS, ZnSe, ZnO or a semiconductor alloy such as $ZnS_xSe_{1-x}$. In some cases, the encapsulation can be a sol-gel, such as a densified sol-gel. In some cases, the index of refraction of the encapsulation is greater than the index of refraction of the outermost layer in the light converting construction 140 (or index at surface 160). In some cases, encapsulation can include at least one of $Si_3N_4$, silicon oxinitride, silicate, ZnS, ZnSe, ZnTe, ZnSSe, ZnSeTe, ZnSTe, CdS, CdSe, CdSSe, ITO, $TiO_2$, $ZrO_2$, $Ta_2O_5$, and $HfO_2$.

The primary purpose of window layer 104 is to provide a barrier so that free carriers such as electron-hole pairs that are photo-generated in an absorbing layer 110 and/or potential well 106 or 108 have no, or very little, chance to migrate to a free or an external surface of the stack. When such free carriers do reach an external surface, there is the risk that they may combine non-radiatively, in some case resulting in degradation of the semiconductor. In some embodiments, the window layer 104 may be understood as having a band gap energy that is greater than the energy of a photon emitted by the LED 102. In such cases, window 104 is substantially transparent to light from the LED (light of the first wavelength), and also transparent to light re-emitted or converted by first type potential wells 106 of the second wavelength 132. The window 104 may also be substantially transparent to light re-emitted or converted by second type potential wells 108 of the third wavelength 134. The window layer may be made of a suitable semiconductor material. In at least one embodiment, the material will be made up in part of II-VI semiconductor materials, such CdMgZnSe quaternary alloy semiconductors.

Surface recombination may not only be an issue at the converter surface 114 near the LED, but also near the emission surface 160 of the semiconductor layer stack 140. Therefore, a second window layer may be located between the second type potential well 108 or the absorber 110 that is most proximate emission surface 160, and the emission surface 160. Such a window layer will serve the same purposes as the window layer 104 described above.

As used herein, potential well means semiconductor layer(s) in a multilayer semiconductor structure designed to confine a carrier in one dimension only, where the semiconductor layer(s) has a lower conduction band energy than the surrounding layers and/or a higher valence band energy than the surrounding layers. The potential well also may be understood as a quantum well. Quantum well generally means a potential well which is sufficiently thin that quantization effects increase the energy for electron-hole pair recombination in the well. A quantum well typically has a thickness of about 100 nm or less, or about 10 nm or less.

In some cases, a potential or quantum well 106 (or 108) includes a II-VI semiconductor potential or quantum well that has a transition energy $E_{pw}$ that that is smaller than the energy $hv_1$ of a photon emitted by the LED 104. In general, the transition energy of a potential or quantum well 106 is substantially equal to the energy $hv_2$ of a photon that is re-emitted by the potential or quantum well. The transition energy of a second type potential or quantum well 108 is substantially equal to the energy $hv_3$ of a photon that is re-emitted by the potential or quantum well. In some cases, potential well 106 can include materials from the II-VI semiconductor family of materials. For example, potential well 106 can include CdMgZnSe alloys having compounds ZnSe, CdSe, and MgSe as the three constituents of the alloy. In some cases, one or more of Cd, Mg, and Zn, especially Mg, may be absent from the alloy. For example, potential well 140 can include a $Cd_{0.70}Zn_{0.30}Se$ quantum well capable of re-emitting in the red, or a $Cd_{0.33}Zn_{0.67}Se$ quantum well capable of re-emitting in the green. As another example, a potential well can include an alloy of Cd, Zn, Se, and optionally Mg, in which case, the alloy system can be represented by Cd(Mg)ZnSe. As another example, a potential well can include an alloy of Cd, Mg, Se, and optionally Zn. In some cases, the potential well can include ZnSeTe. In some cases, a quantum well has a thickness in a range from about 1 nm to about 100 nm, or from about 2 nm to about 35 nm.

In general, potential wells can have any conduction and/or valence band profile. Exemplary profiles are described in, for example, U.S. patent application No. 60/893,804.

In some cases, potential wells can be n-doped or p-doped where the doping can be accomplished by any suitable method and by inclusion of any suitable dopant. In some cases, the electroluminescent device and a potential well can be from two different semiconductor groups. For example, in such cases, the electroluminescent device 102 can be a III-V semiconductor device and potential well can be a II-VI potential well. In some cases, electroluminescent device 102 can include AlGaInN semiconductor alloys and potential well can include Cd(Mg)ZnSe semiconductor alloys where a material enclosed in parentheses is an optional material.

In some cases, the semiconductor layer stack 140 may include other layers. Although not shown in FIG. 1, the stack may include, for example, one or more "barrier layers." Such barrier layers may serve to block free carriers in the light absorbing layers from diffusing to another layer. In other words, the layer may serve to direct free carriers in a chosen direction, much the same as the window layers.

All of the layers in the semiconductor layer stack may be formed and stacked upon one another by epitaxially growing the layers on top of one another sequentially. Any suitable method of epitaxial growth may be used, such as molecular beam epitaxy (MBE). The layers may be made up of similar materials or different materials. In at least one embodiment, all of the layers in the semiconductor layer stack are made of II-VI semiconductor materials. In at least some embodiments all of the layers may include Cd, Mg, Zn and Se. The layers may be grown on a substrate with a buffer layer. The substrate may be any suitable material, such as InP. The buffer layer may be made of GaInAs in at least one embodiment. Other materials not specifically noted here are also contemplated as substrate and buffer layers for use in epitaxial growth.

Although the aperture 120 in the semiconductor wavelength converting layer stack 140 allows for most easily quantifiable and efficient emission of light of the first wavelength, e.g. blue light, efficiency issues may still arise in the layer stack 140. For example, in some situations, there is a risk that light of a third wavelength 134 generated in the second type potential wells 108 may be absorbed by the first type potential wells 106. Light that is converted in the second type potential wells has a shorter wavelength than that converted in the first type potential wells. Accordingly, this third wavelength light 134 may be absorbed by first type potential well 106 generating electon-hole pairs. A portion of these carriers will recombine radiatively, generating more light of the second wavelength light 132. Such absorption therefore will affect both the efficiency of the system, and the color output of the semiconductor layer stack 140 and therefore color mixture of the entire system 100. This problem can be addressed by minimizing the number of first type potential wells 106, and thereby minimizing the absorption of the third-wavelength light. Depending on the desired output spectrum, a single first type potential well may be sufficient, particularly if it is located near the window where the intensity of the pump light (first wavelength) is highest. Conversely, it is typically necessary to use a larger number of second type potential wells. This is because a relatively large total thickness of absorbing layers is required to absorb the remaining pump light. To ensure efficient collection of the photogenerated carriers, several second type quantum wells are therefore typically required. In general, where there are n second type potential wells, and m first type potential wells, n is greater than m (where both n and m are integers). One particular embodiment, there may be a plurality of second type potential wells 108, and only one first type potential well 106.

Another aspect that provides for minimized absorption of converted light of the third wavelength 134 is placing the first type potential well(s) 106 all closer in proximity to the LED 102, and therefore further away from the stack emission surface 160, than the second type potential wells 108. This allows some of the third wavelength light to escape through emission surface 160 without having to travel through a first type potential well. In this configuration, only that portion of the third wavelength light 134 that is emitted or backscattered toward the LED 102 may encounter a first type potential well 106. However, because the number of first type potential wells 106 can be minimized in this configuration, a minimum amount of this light will be reabsorbed.

Although not illustrated in the figures included herewith, the light emitting system described herein may also include electrodes. Such electrodes may be placed near the surface of LED 114 and serve to drive current through the LED 102, to provide for emission of light at surface 114. Electrodes may be made of any suitable material known in the art, including but not limited to metals, or metal alloys including: gold, silver, aluminum, nickel, titanium, chromium, platinum, palladium, rhodium, rhenium, ruthenium, tungsten, indium and mixtures and alloys of such. Electrodes may typically be driven by an external controller that is connected by wiring. Electrodes may also be understood as being in electrical contact with the LED. For instance, the electrodes may be in a closed electrical circuit with the LED. Optimal placement of electrodes in a light emitting system related to that disclosed here may be found by reference to commonly owned and contemporaneously filed U.S. Patent Application: "Light Converting and Emitting Device with Minimal Edge Recombination," 61/351,566.

EXAMPLES

Example 1

Figure 2:
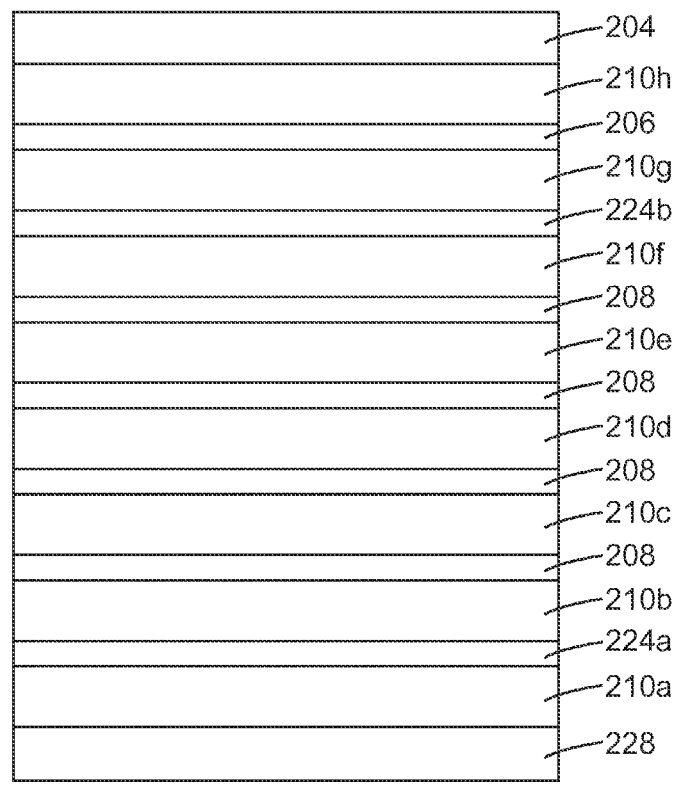
FIG. 2 is a cross-sectional view of a semiconductor layer stack.

An article according to the present description was constructed and tested for performance. FIG. 2 illustrates the stack. Although not shown the entire stack was grown on an InP substrate. Directly on top of the substrate was a GaInAs buffer layer 228. The layers were grown by molecular beam epitaxy. The first layer was an absorber 210a. The absorber was constructed to absorb light at wavelengths shorter than 475 nm. The absorber therefore worked to absorb blue light. Layer 210a was 600 nm in thickness. On top of the absorber layer was grown a barrier layer 224a. The barrier layer was 20 nm thick, and had a band gap energy greater than the absorber layers. Grown on the barrier layer was an absorber layer 210b, again absorbing wavelengths shorter than 475 nm, with a thickness of 129 nm. On top of the absorber 210b was a "green" quantum well 208 that emits light at a wavelength of 540 nm.

The layers grown sequentially over this first green quantum well were absorber 210c, green quantum well 208, absorber 210d, green quantum well 208, absorber 210e, green quantum well 208, and absorber 210f, followed by a second barrier layer 224b. Each of the green quantum wells (n=4) were a thickness of 2.6 nm and each emitted light at a wavelength of 540 nm. The thicknesses of the absorbing layers in this section of the semiconductor layer stack were as follows: 210b=129 nm; 210c=183 nm; 210d=87 nm; 210e=55 nm; and 210f=23 nm. These absorber thicknesses were chosen to provide approximately the same flux of electron-hole pairs to each green quantum well. The second barrier layer 224b had the same characteristics as the first barrier layer 224a. On the second barrier layer was grown another absorber 210g. The absorber was again blue light absorbing (475 nm) and was 55 nm thick. On absorber 210g was grown a single "red" quantum well 206 (m=1). The red quantum well emits light at a wavelength of 624 nm. On this red well 206 was grown another absorber layer 210h that was 55 nm thick, followed by a window layer 204. The window layer was 500 nm thick and was strained and graded.

After growth, the window-layer surface of the color converting stack was attached to a blue LED using an optical adhesive (Norland 83H). The InP substrate and GaInAs buffer layer were then removed by selective wet chemical etching.

Figure 3:
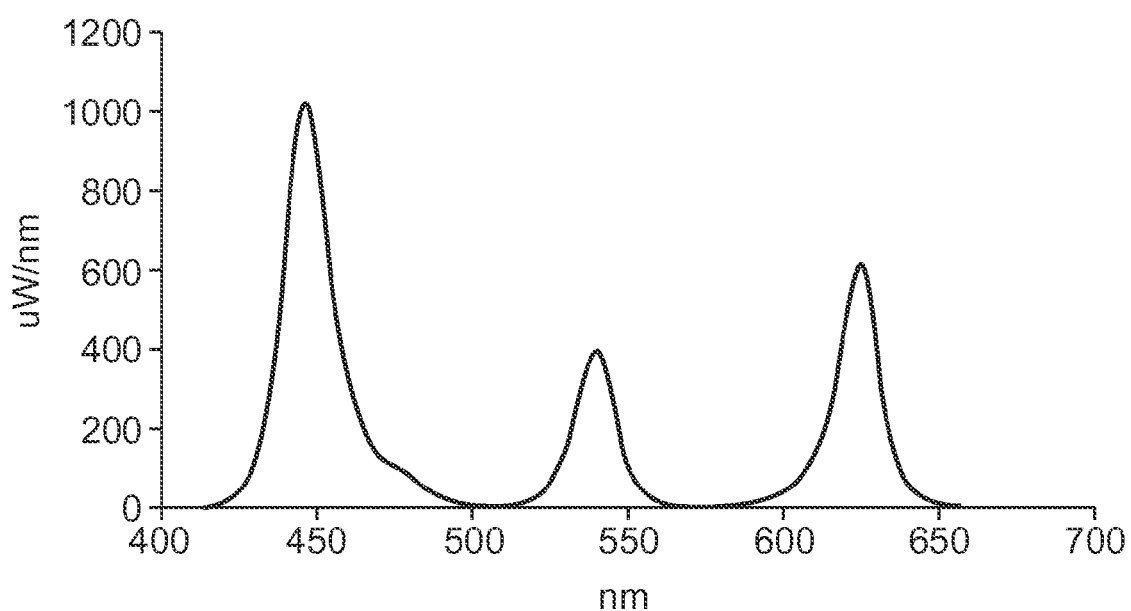
FIG. 3 is a graph of the emission spectrum of a light emitting system according to the present description.

Apertures (or non-converting regions) were then etched into the stack. The regions were created such that the remaining converter stack covered 73% of the LED surface. More specifically, the semiconductor layer stack was etched into stripes with the width of the remaining semiconductor stripes approximately 182 µm wide vs. an aperture stripe width of 68 µm. The LED was excited with 100 mA dc current and the spectrum of the light emitting system was measured. The spectrum is displayed in FIG. 3 As may be noted, the blue peak centered at 446 nm represents 55% of the optical power from the converted LED. The green peak centered at 540 nm represents 17%, and the red peak centered at 624 nm represents 28% of the emitted optical power. Given the aperture coverage ratio disclosed, it was possible to calculate that the quantum conversion efficiency for the light emitting system was 40%. To the eye, the emitted light was a cool white.

We claim:

1. A light emitting system, comprising:
    an LED emitting pump light of a first wavelength from an emission surface of the LED; and
    a semiconductor layer stack disposed on the emission surface of the LED, the semiconductor stack comprising:
        m first type potential wells that absorb the pump light and emit light of a second wavelength longer than the first wavelength, m being an integer greater than or equal to one; and
        n second type potential wells that absorb the pump light and emit light of a third wavelength longer than the first wavelength and shorter than the second wavelength, n being an integer greater than m; and
        at least one region in the semiconductor stack allowing a portion of the pump light of the first wavelength to exit the light emitting system without going through the first or second type potential wells.

2. The light emitting system of claim 1, wherein m is equal to one.

3. The light emitting system of claim 1, wherein n is greater than or equal to 3.

4. The light emitting system of claim 1, further comprising a plurality of regions that allow pump light of the first wavelength to travel through the semiconductor layer stack without wavelength conversion.

5. The light emitting system of claim 1, wherein the semiconductor layer stack further comprises a plurality of absorbers for absorbing the pump light, the absorbers being stacked adjacent the first and second type potential wells.

6. The light emitting of claim 4, wherein an absorber layer closer to the emission surface of the LED is thinner than an absorber layer further from the surface of the LED.

7. The light emitting system of claim 1, wherein the semiconductor layer stack further comprises a window layer located between the LED and the first and second type potential wells.

8. The light emitting system of claim 6, wherein the window layer comprises a compositionally graded layer.

9. The light emitting system of claim 1, wherein the first type potential wells are closer to the emission surface of the LED than the second type potential wells.

10. The light emitting system of claim 1, wherein the pump light of the first wavelength is a blue light.

11. The light emitting system of claim 1, wherein the second wavelength is a red light.

12. The light emitting system of claim 1, wherein the third wavelength is a green light.

13. The light emitting system of claim 1, wherein the first type potential wells and second type potential wells are each comprised of II-VI semiconductor materials.

14. The light emitting system of claim 12, wherein the II-VI semiconductor materials comprise Cd, Zn, Se and optionally Mg.

15. The light emitting system of claim 1, wherein first type potential wells are so positioned as to limit absorption of light of the third wavelength by the first type potential wells.

16. The light emitting system of claim 1, wherein the m first type potential wells are between the n second type potential wells and the LED.

17. The light emitting system of claim 1, wherein the majority of pump light emitted from the system exits the system through the region, and the majority of light of the second and third wavelengths exits the system through the semiconductor layer stack.

18. The light emitting system of claim 1, wherein the system emits white light.

19. The light emitting system of claim 1, wherein the at least one region is comprised of a material transparent to the pump light.

20. The light emitting system of claim 18, wherein the at least one region is comprised of glass, silicon nitride, optical adhesive, or a silicone encapsulant.

* * * * *

UNITED STATES PATENT AND TRADEMARK OFFICE
CERTIFICATE OF CORRECTION

PATENT NO. : 8,710,533 B2  Page 1 of 1
APPLICATION NO. : 13/701145
DATED : April 29, 2014
INVENTOR(S) : Michael Haase It is certified that error appears in the above-identified patent and that said Letters Patent is hereby corrected as shown below:

In the Specification

<u>Column 7</u>

Line 20, delete "clecton-hole" and insert -- electron-hole --

In the Claims

<u>Column 9</u>

Line 32, delete "emitting of" and insert -- emitting system of --

Signed and Sealed this
Twentieth Day of January, 2015

Michelle K. Lee
*Deputy Director of the United States Patent and Trademark Office*